United States Patent
Lin et al.

(10) Patent No.: US 7,640,085 B2
(45) Date of Patent: Dec. 29, 2009

(54) METHOD AND APPARATUS TO PROVIDE VEHICLE INFORMATION TO A REQUESTOR

(75) Inventors: William C. Lin, Troy, MI (US); David M. Sidlosky, Beverly Hill, MI (US); Jing Zhang, Grosse Pointe Park, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 308 days.

(21) Appl. No.: 11/272,557

(22) Filed: Nov. 10, 2005

(65) Prior Publication Data

US 2007/0106439 A1    May 10, 2007

(51) Int. Cl.
G06F 7/00    (2006.01)
(52) U.S. Cl. .................. 701/36; 701/1; 701/23; 340/815.4; 340/988; 345/156; 307/10.1
(58) Field of Classification Search .......... 701/36, 701/1
See application file for complete search history.

(56) References Cited

U.S. PATENT DOCUMENTS

| | | | | |
|---|---|---|---|---|
| 4,630,043 A | * | 12/1986 | Haubner et al. | 340/825.57 |
| 4,787,040 A | * | 11/1988 | Ames et al. | 701/1 |
| 5,091,856 A | * | 2/1992 | Hasegawa et al. | 701/36 |
| 5,555,502 A | * | 9/1996 | Opel | 701/36 |
| 6,067,489 A | * | 5/2000 | Letang et al. | 701/36 |
| 6,104,101 A | * | 8/2000 | Miller et al. | 307/10.1 |
| 6,182,171 B1 | * | 1/2001 | Akatsuka et al. | 701/1 |
| 6,275,231 B1 | * | 8/2001 | Obradovich | 701/36 |
| 6,369,717 B1 | * | 4/2002 | Damiani et al. | 340/815.4 |
| 6,636,156 B2 | * | 10/2003 | Damiani et al. | 340/815.4 |
| 6,647,328 B2 | * | 11/2003 | Walker | 701/36 |
| 2001/0001319 A1 | * | 5/2001 | Beckert et al. | 701/36 |
| 2002/0055811 A1 | * | 5/2002 | Obradovich | 701/23 |
| 2003/0074119 A1 | * | 4/2003 | Arlinsky | 701/36 |
| 2005/0080528 A1 | * | 4/2005 | Obradovich | 701/36 |
| 2007/0106439 A1 | * | 5/2007 | Lin et al. | 701/36 |

\* cited by examiner

*Primary Examiner*—Khoi Tran
*Assistant Examiner*—Jonathan Sample

(57) ABSTRACT

An on-board information system is provided, including a help facility, which is operable to provide information to a requester. The information comprises audio or audio-visual descriptions for operating various systems and control devices, using on-board or off-board devices. An information system is provided, comprising a requestor-initiated information inquiry device, an information storage system, and, an information communications center. The information storage system communicates information to the communications center based upon a request for information initiated by the requester to the information inquiry device. The request for information can be canceled during delivery. The system is applicable to vehicles and other systems wherein operators may have limited knowledge of functioning of all aspects of the system.

9 Claims, 2 Drawing Sheets

METHOD AND APPARATUS TO PROVIDE VEHICLE INFORMATION TO A REQUESTOR

TECHNICAL FIELD

This invention pertains generally to an information system, and more specifically to having an operator's manual available through a broadcasting system, such as on a vehicle.

BACKGROUND OF THE INVENTION

Modern vehicles contain a plethora of systems, devices, and features, many of which are incompletely understood by a typical vehicle operator or other occupants seeking information. These systems include, for example, radios and more complex entertainment systems, instrument panel gauges and indicator lamps which monitor and report on vehicle operation, control and activation switches for various devices such as cruise control and active suspension systems, and access covers to vehicle operating systems such as fuse boxes and various underhood fluid fill systems, among others. Many of these devices are identified using displays or icons not familiar to an operator, or lacking in description. Increased vehicle complexity in the form of enhanced on-vehicle systems, e.g. changing a traditional cruise control system to active cruise control system, and increased quantity of systems and devices all increase the likelihood that system features may be underutilized.

Vehicle manufacturers often communicate information about various systems to vehicle operators and other occupants through an owner's or operator's manual, which is a hardcopy book typically contained in a compartment of the vehicle. This book may be cursorily reviewed with a new vehicle purchaser during an orientation session at the time of purchase.

An operator's ability to access and retrieve information in a timely manner from the vehicle operator manual is often less than desirable, leading to underutilization of features. Therefore, there is a need for an on-board system which provides an operator relevant information about specific vehicle systems and features.

SUMMARY OF THE INVENTION

Therefore, what is provided is an on-board vehicle information system, including a help facility, which is operable to provide information to the vehicle operator or other requestor comprising descriptions for operating various systems and control devices in an audio, visual, or audio-visual format. The information may be presented to the requester in visual, audio, or audio-visual form using a graphic display, audio system or other audio or visual mechanisms existing on-board. The implemented system includes a device or method which receives, recognizes, and processes a request from a vehicle operator or passenger, a searchable information storage device containing pertinent vehicle information, and an information delivery system.

In order to achieve the object of this invention, an information system for a vehicle is provided, comprising a requestor-initiated information inquiry device, an information storage and retrieval system, and, a communications center.

An aspect of the invention includes the information storage and retrieval system operable to communicate information to the communications center based upon a request for information initiated by the requestor to the information inquiry device.

Another aspect of the invention includes the contents of the information storage and retrieval system comprising a plurality of descriptions, each related to a vehicle feature.

Another aspect of the invention includes the requestor-initiated information inquiry device comprising a key operable to actuate a vehicle function, wherein actuation of the information inquiry device comprises extended actuation of the key.

Another aspect of the invention is the requestor-initiated information inquiry device comprising an inquiry key coupled with a device actuator, wherein the inquiry key is operable to cancel the inquiry when subsequently actuated.

Another aspect of the invention is the requestor-initiated information inquiry device comprising a graphic user interface device including a touch-screen function. The graphic user interface device may be an element of an on-board device, or alternatively, an element of a remote handheld device.

Another aspect of the invention is the information storage and retrieval system comprising a storage medium electronically readable by an on-vehicle system, wherein contents of the storage medium comprise a plurality of descriptions, including operating instructions, each related to a vehicle feature. The descriptions and operating instructions comprise electronically-retrievable representations of images and sound. The information stored in the information storage system is updateable. The information storage system may comprise an electronic memory device remote from the vehicle, such as a remote-access intranet or public Internet server.

Another aspect of the invention is the communications center, comprising an on-board audio-visual display device, or an audio device. The aforementioned remote handheld device may serve as the communication center.

Another aspect of the invention includes a method for providing vehicle information to a requestor, including providing a requestor-initiated information inquiry device, an information storage device, and a communications center, and determining input from the requestor, activating a request for information to the information storage device; and, communicating information from the information storage media based upon the input from the requestor.

Another aspect of the invention includes a system to deliver information to an operator of an apparatus. The system comprises an operator-initiated information inquiry device, a communications center, and, an information storage system. The system is operable to communicate information to the communications center based upon a request for information initiated by the operator to the information inquiry device. The operator-initiated information inquiry device comprises: an inquiry key, and, a key operable to actuate a function of the apparatus.

These and other aspects of the invention will become apparent to those skilled in the art upon reading and understanding the following detailed description of the embodiments.

BRIEF DESCRIPTION OF THE DRAWINGS

The invention may take physical form in certain parts and arrangement of parts, the preferred embodiment of which will be described in detail and illustrated in the accompanying drawings which form a part hereof, and wherein.

DETAILED DESCRIPTION OF THE PREFERRED EMBODIMENT

Figure 1:
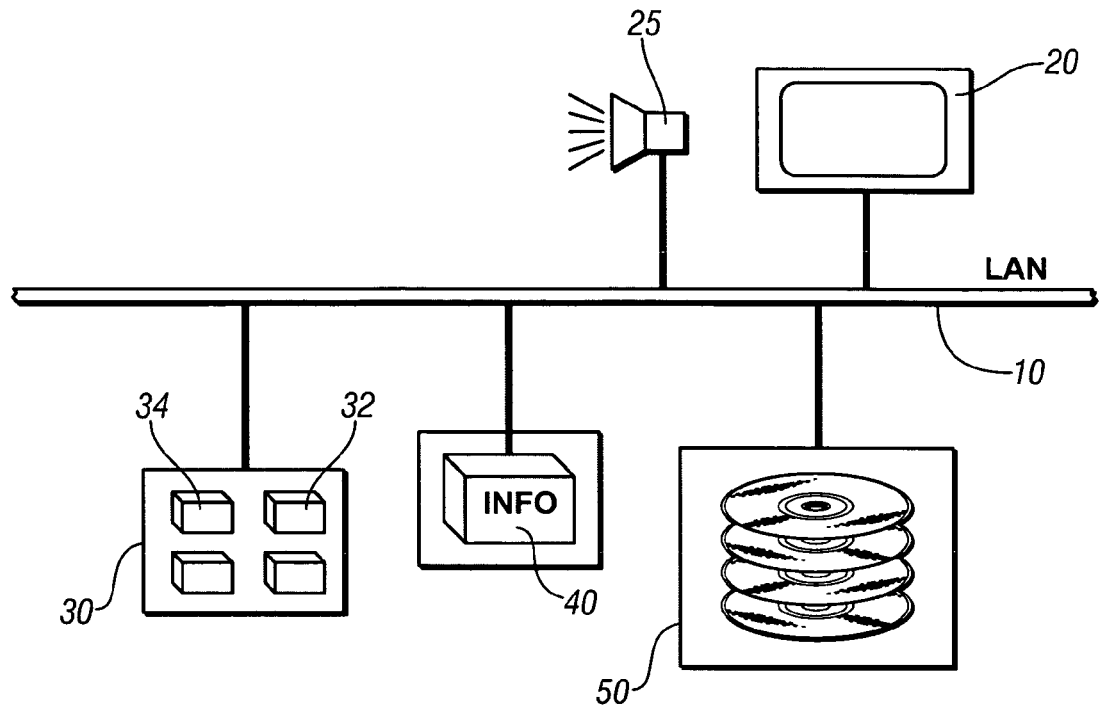
FIG. 1 is a schematic diagram of a distributed system architecture, in accordance with the present invention; and, FIGS. 2 and 3 are schematic diagrams of alternate distributed system architecture, in accordance with the present invention.

Referring now to the drawings, wherein the showings are for the purpose of illustrating the invention only and not for the purpose of limiting the same, FIG. 1 shows a schematic diagram of an information system comprising a distributed system architecture operable to provide information regarding an element or feature of an apparatus to a requester, which has been constructed in accordance with an embodiment of the present invention. The requester is typically an operator of the apparatus. In the embodiments described herein, the apparatus comprises a vehicle having operator, such as a passenger vehicle for use on public highways. It is understood that the present embodiments are illustrative, and not meant to limit the scope of the invention.

The invention described herein is an information system for the apparatus, comprising an operator-initiated information inquiry device 30, 40, an information storage system 50, and, a communications center 20, 25. The communications center 20, 25 is operable to communicate pertinent information retrievable from the information storage and retrieval system 50 to the requester, based upon an input by the requester to the information inquiry device 30, 40. The operator-initiated information inquiry device 30, 40, information storage and retrieval system 50, and the communication center 20, 25 are each signally and operably connected by way of a local area network ('LAN') 10 on-board the apparatus. The LAN 10 comprises a known communications bus which executes standardized communications protocols to effect communication of information between the various elements of the distributed system architecture. When the apparatus is a vehicle, the information system preferably comprises operator-initiated information inquiry device 30, 40, information storage and retrieval system 50, and, communications center 20, 25, each which are described hereinafter.

Figure 2:
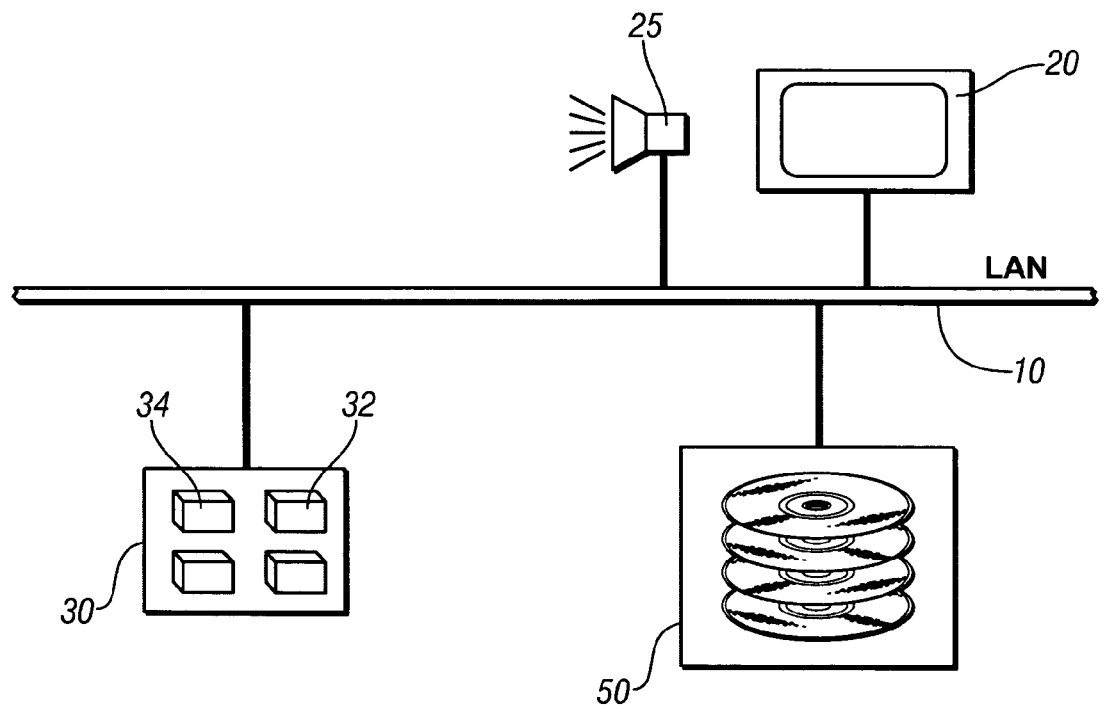
Figure 3:
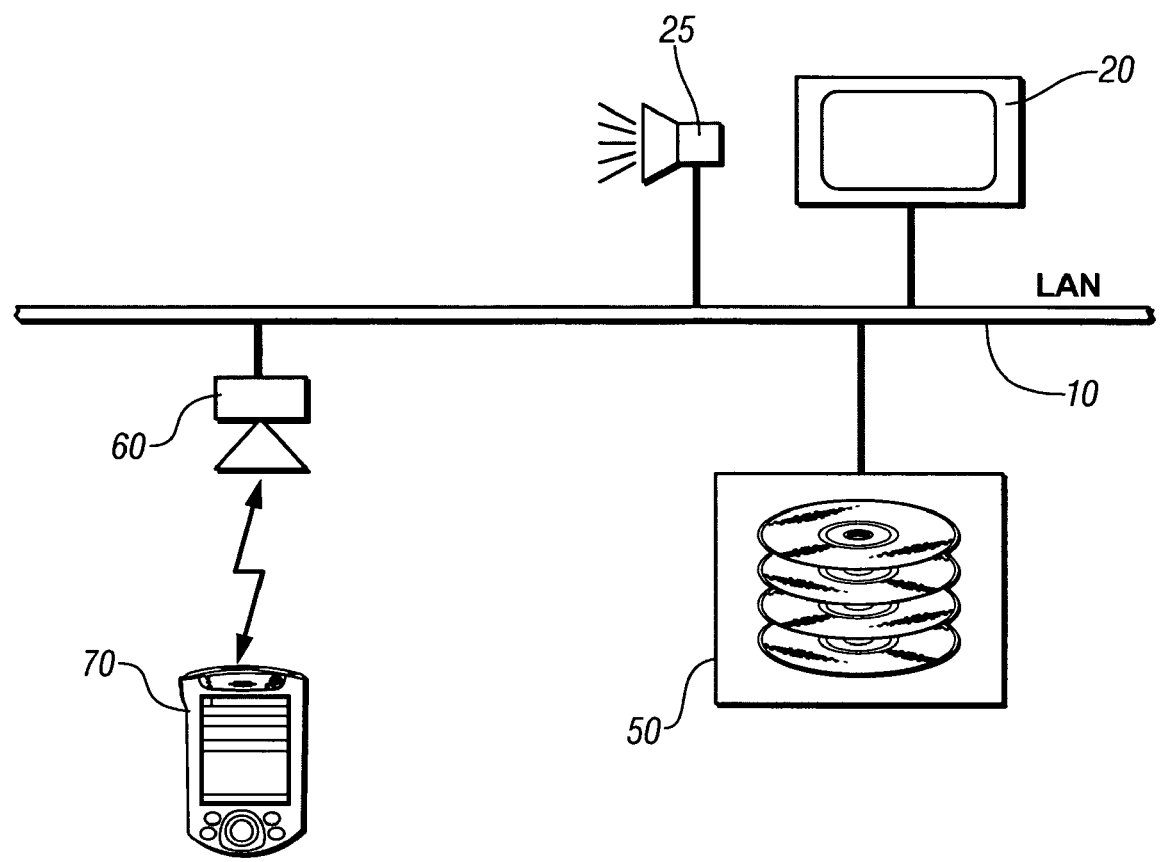

Referring now to FIGS. 1, 2, and 3, the operator-initiated information inquiry device 30, 40 can take several forms. An exemplary inquiry device 40 can comprise a HELP or INFO key 40 executed in an operator information center or driver's information center ('DIC') situated in a cockpit on-board the vehicle, typically executed as an element of a dashboard. There are one or more control clusters 30 proximal to the vehicle operator, each control cluster 30 comprising a user interface having at least one key or push-button device 32, 34, or other control actuator operable to control a specific functional area or feature of a functional area. Examples include cruise control switches and audio entertainment centers.

Alternatively, with reference now to FIG. 2, the information inquiry device 30 can comprise control cluster 30 including the user interface having at least one key 32, 34, or other control actuator, wherein duration of actuation of one of the specific keys is monitored, preferably in a control device. In this specific system, when the requestor actuates a specific key for a short time period, e.g. less than a half second, then the control feature for which the specific key or button is responsible is thereby activated. However, when the requestor actuates the specific key for an extended period of time, e.g. greater than two seconds, the information storage system 50 is thereby notified via the LAN 10 of a request for additional information about the function associated with the specifically actuated key, and relevant information is delivered to the requester via the communications center 20, 25, as described below. Alternatively, repeated multiple actuations of a specific key or button in a short period of time—similar to a double click on a computer mouse—can be interpreted as a request for additional information related to the function associated with the specific key actuated.

Alternatively, with reference now to FIG. 3, the information inquiry device can comprise a graphic user interface ('GUI') 70 associated with a display device contained within the vehicle cockpit. The GUI 70 typically includes a touch-screen or associated keypad intended to control a specific functional area or feature of a specific functional area, through physical manipulation of an icon on the touch-screen or keypad. Actuation of keys is monitored, preferably in an associated control device. The GUI 70 can be hardwired to the LAN 10 (not shown) or alternatively, the GUI 70 can be a wireless handheld device which communicates to the system via a wireless communication system 60, as shown in FIG. 3.

Cancellation of the request for information may be effected, preferably by a repeat of the procedure to activate the initial request for information, delivered during the time when the information is being retrieved and delivered to the requester. Alternatively, cancellation of the request for information may be effected by actuation of a key specifically intended to cancel such requests for information. This cancellation key can take the form of a unique key specifically intended to cancel an information request. Alternatively, the cancellation key can take the form of the INFO key 40 (shown in FIG. 1). In this configuration, when the INFO key 40 is subsequently actuated following an initial information request, the subsequent actuation signal is interpretable by the information storage and retrieval system 50 as a command to cancel the information request.

The information storage and retrieval system 50 comprises a control device coupled to an internal storage media containing digital representations of pertinent information. When the apparatus comprises a vehicle, the substantive content of the internal storage media comprises a plurality of descriptions, including operating instructions, for various vehicle features and functions of the features. Exemplary features and functional areas include vehicle adaptive cruise control, windshield wiper systems, audio/entertainment systems, and programmable adjustable seats, among others.

The control device is operable to interpret signal information from the information inquiry device communicated via the LAN 10, and, access and retrieve pertinent information from the storage media for communication to the requestor. The pertinent information stored in the storage media is preferably updateable. The internal media can take the form of non-volatile memory, including reprogrammable memory such as an electrical erasable programmable ready-only memory device ('EEPROM'). Alternatively, the internal media may take the form of a compact disc that is included as an element of the vehicle audio, entertainment or navigation system. Alternatively, the information storage system 50 may comprise a control device signally coupled to a communications conduit operable to communicate with a remote location to access and retrieve pertinent information. The communication conduit comprises an on-board communications device, such as WiFi or cellular, operable to communicate to a remote server operable to access Internet or intranet servers. The on-board communications device may be operable to communicate with a handheld device. For example, both cellular packet data and wireless local area network ('LAN') systems are commonly available. Typical cellular packets wireless data communications currently available, e.g. 1×RTT or GPRS, are operable to provide 20-60 kilobits per second throughput with moderate latency. Wireless LAN system, e.g. 802.11b or 802.11g, yield sustained throughput of 2-30 megabits per second with low latency. For example, a help-file lasting thirty seconds, which may be encoded at eight kilobits per second with good quality, the entire file can be retrieved over packet cellular from an Internet server in at most twelve seconds. Because this is faster than real-time and allows streaming playback, audio output can begin in a few seconds. Alternatively, when the file is stored on a wireless LAN-equipped portable device like a PDA or laptop computer, the audio can be retrieved almost instantly. In each embodiment described, the retrievable pertinent information comprises information descriptive of various systems, organized for retrieval based upon construction of the various information inquiry devices 30, 40, 70 executed in the vehicle. The retrievable pertinent information descriptive of various systems can comprise information typically found in an operator's manual stored the vehicle, or may comprise more in-depth information.

The communication center 20, 25 comprises one of several systems having devices to communicate pertinent information to the requester. The communication center can comprise an existing vehicle audio system, shown herein as 25, whereby pertinent information is delivered to the requester audibly via speakers of the audio system, which necessarily is operable to communicate with the information storage and retrieval system 50 via the LAN 10. Alternatively, the communication center may comprise an in-vehicle visual display module 20, including for example, known LED displays, CRT displays, DVD devices, or head-up display devices, each which are executed in-vehicle and operable to communicate with the information storage and retrieval system 50 via the LAN 10. The visually-displayed information can be entirely visual, or a combination of audio and visual information useable by the requester. Alternatively, the communication center may comprise a remote device, such as the personal digital assistant ('PDA') 70 which is operable to communicate with the information storage and retrieval system 50 over the LAN 10 using a hardwire connection or a wireless connection 60.

The retrieved pertinent information may be delivered to a non-vehicle device, including PDAs or other handheld devices, either wireless or wired. Such handheld devices may include a graphic user interface ('GUI') with a pan-and-zoom feature showing all or a portion of vehicle interior, underhood, or exterior. In this configuration, when an area of interest is selected by the requestor using such modalities as tapping on the GUI or a voice-command, an audio stream or graphic/video output is delivered, as described above. In such scenarios, specific control devices, gauges, functions, or operations contained in a portion of the vehicle interior, underhood, or exterior can be identified on the GUI of the handheld device, and pertinent information can be retrieved by 'tapping' on the portion of the graphic interface of the control device that is of interest.

Referring again to FIG. 1, the first embodiment comprises information inquiry device 30, 40, information storage system 50, and, communications center 20, 25. The information inquiry device comprises INFO key 40 and one or more control clusters 30. Each control cluster 30 comprises a user interface having at least one button 32, 34 or key operable to control a specific functional area or feature of a functional area. Exemplary functional areas include vehicle adaptive cruise control, windshield wiper systems, audio/entertainment systems, and programmable adjustable seats, among others. The information storage system 50 is operable to recognize that an inquiry for information regarding a specific functional area has been requested based upon requestor input to the INFO key 40 and specific button, one of 32, 34 of control cluster 30. In this embodiment, the requestor preferably makes an inquiry for information regarding a specific functional area by actuating the INFO button 40 and subsequently or simultaneously actuating one of the buttons 32, 34 of the control cluster 30 related to the function for which an inquiry is being requested. The inquiry is communicated to the information storage system 50 over the LAN 10. The information storage and retrieval system 50 interprets the request for information, retrieves pertinent information from storage, and communicates the information to the communication center 20, 25.

Referring now to FIG. 2, the second embodiment is described, comprising information inquiry device 30, information storage and retrieval system 50, and, communications center 20, 25. The information inquiry device 30 comprises one or more control clusters. Each control cluster 30 comprises a user interface having at least one button or key 32, 34 operable to control a specific functional area or feature of a functional area. The information storage system 50 is operable to recognize that an inquiry for information regarding a specific functional area has been requested based upon requestor input to a specific button of control cluster 30. In this embodiment, the requestor preferably makes an inquiry for information regarding a specific functional area by actuating the one of the buttons 32, 34 of the control cluster 30, wherein the actuation is extended for several seconds. The actuated button of the control cluster 30 is related to the function for which an inquiry is being requested. The inquiry is communicated to the information storage system 50 over the LAN 10. The information storage and retrieval system 50 interprets the request for information, retrieves pertinent information from storage, and communicates the pertinent information to the communication center 20, 25.

Referring now to FIG. 3, the third embodiment is described, comprising a remote inquiry device, such as the previously described personal digital assistant ('PDA') 70 operable to communicate to the LAN 10 using on-vehicle wireless communication device 60. The system includes the information storage and retrieval system 50, and, optionally, the communications center 20, 25. Optionally the personal digital assistant ('PDA') 70 may fulfill the visual, audio or audio-visual functions of the communication center. The user interface of the PDA 70 is operable to identify a specific functional area or feature of a functional area, and communicate such information to the information storage and retrieval system 50. The information storage and retrieval system 50 recognizes the inquiry for information regarding a specific functional area, based upon information communicated from the PDA 70 via wireless connection 60 and LAN 10. In this embodiment, the requestor preferably makes an inquiry for information regarding a specific functional area by touching a graphic icon on the screen which represents the specific functional area. The inquiry is communicated to the information storage system 50 over the LAN 10. The information storage and retrieval system 50 interprets the request for information, retrieves pertinent information from storage, and communicates the pertinent information to the PDA 70 for display, or to the communication center 20, 25.

The invention has been described with specific reference to the preferred embodiments and modifications thereto. Further modifications and alterations may occur to others upon reading and understanding the specification. It is intended to include all such modifications and alterations insofar as they come within the scope of the invention.

Having thus described the invention, it is claimed:

1. An information system for a vehicle, comprising:

an information inquiry device comprising an actuator key operable to control a feature of a functional area of the vehicle and an information key;

an information storage and retrieval system comprising a control device coupled to a storage media operative to store and retrieve a description of the feature of the functional area based upon a requestor input comprising activation of the actuator key and the information key; and a communications center configured to communicate the description of the feature of the functional area of the vehicle, wherein the description of the feature of the functional area comprises an operating instruction related to the feature of the functional area.

2. The system of claim 1, further comprising the storage media operative to store a plurality of descriptions of features of functional areas of the vehicle.

3. The system of claim 2, wherein the operating instruction related to the feature of the functional area comprises electronically-retrievable representations of images and audio.

4. The system of claim 3, wherein the electronically-retrievable representations of images and audio of the information storage and retrieval system are updateable.

5. The system of claim 1, wherein the information key is further operable to cancel an information inquiry.

6. The system of claim 1, wherein the storage media of the information storage and retrieval system comprises an electronic memory device remote from the vehicle.

7. The system of claim 1, wherein the communications center comprises an on-board audio-visual display device.

8. The system of claim 1, wherein the communications center comprises an audio device.

9. A system to deliver information to an operator of an apparatus, comprising:

an operator-controlled actuator key operable to actuate a feature of a functional area, wherein the feature of the functional area is actuated based on an operator-controlled input to the actuator key with a first pattern of actuation;

a communications center configured to communicate a description of the feature of the functional area of the vehicle; and an information retrieval system comprising a control device coupled to a storage media operative to retrieve the description of the feature of the functional area based upon the operator-controlled input to the actuator key with a second pattern of actuation, wherein the description of the feature of the functional area comprises an operating instruction related to the feature of the functional area.

* * * * *